United States Patent [19]

Bellman et al.

[11] Patent Number: 4,952,026

[45] Date of Patent: Aug. 28, 1990

[54] INTEGRAL OPTICAL ELEMENT AND METHOD

[75] Inventors: Robert H. Bellman, Catlin; Nicholas F. Borrelli, Elmira; Bruce H. Raeder, Horseheads, all of N.Y.

[73] Assignee: Corning Incorporated, Corning, N.Y.

[21] Appl. No.: 354,843

[22] Filed: May 22, 1989

Related U.S. Application Data

[63] Continuation-in-part of Ser. No. 257,947, Oct. 14, 1988.

[51] Int. Cl.$^5$ .......................... G02B 1/00; G02B 27/00
[52] U.S. Cl. .................................... 350/167; 350/417; 427/162; 430/322
[58] Field of Search ...................... 350/167, 417, 330; 427/162, 161; 204/192.26; 430/269, 322

[56] References Cited

U.S. PATENT DOCUMENTS

| | | | |
|---|---|---|---|
| 2,564,709 | 8/1951 | Mochel | 201/73 |
| 2,628,160 | 2/1953 | Stookey | 65/111 |
| 4,273,826 | 6/1981 | McCollister et al. | 427/162 |
| 4,425,501 | 1/1984 | Stauffer | 350/167 |
| 4,518,222 | 5/1985 | Borrelli et al. | 350/167 |
| 4,572,611 | 2/1986 | Bellman et al. | 350/167 |

OTHER PUBLICATIONS

Borrelli, Morse, Bellman and Morgan, "Photolytic Technique for Producing Microlenses in Photo-Sensitive Glass," *Applied Optics*, vol. 24, No. 16, 8/15/85.

*Primary Examiner*—Rodney B. Bovernick
*Assistant Examiner*—David R. Parsons
*Attorney, Agent, or Firm*—Milton M. Peterson; Clinton S. Janes

[57] ABSTRACT

There is disclosed an optical element having a pattern of raised optical elements integral with a surface thereof, and a metal coating selectively covering the surface intermediate the optical elements to form a mask optically isolating the elements. Several methods of producing such metal coating are disclosed that employ conventional photoresist materials and means of applying and removing such materials. Also, a modified element, that is adapted to use in a liquid crystal display device, and methods of producing such modified element are disclosed.

40 Claims, 7 Drawing Sheets

INTEGRAL OPTICAL ELEMENT AND METHOD

This application is a Continuation-In-Part application of Ser. No. 257,947, filed Oct. 14, 1988.

FIELD OF THE INVENTION

The invention relates to an optical element that has a lens array integral with at least one surface of the element. It is particularly concerned with optical isolation of the lenses on such an element to permit selective light transmission.

BACKGROUND OF THE INVENTION

U.S. Pat. No. 4,572,611 (Bellman et al.) discloses an apparatus embodying an optical element adapted to focus an image on a receiving surface. That device is a glass body having an integral lens array on at least one surface of the body. In a preferred form, the glass body has lens arrays formed on opposite surfaces, and composed of individual, opposed lens pairs joined by transparent channels. These channels are surrounded by photonucleated, opacified glass.

A lens array may be formed by selective photonucleation of the glass body. This also provides a degree of optical isolation of the transparent channels to prevent light transfer between channels. Such transfer is commonly referred to as "crosstalk".

PURPOSES OF THE INVENTION

The optical isolation provided by the selectively opacified zones may be inadequate for some applications. This is especially true for applications involving silicon-based detection means where the region of optimum sensitivity is from 650 to 800 nm. The light absorption provided by the opacified glass falls off too steeply in this portion of the spectrum to provide the desired degree of optical isolation.

A basic purpose of the invention then is to improve the optical element of the Bellman et al. patent by providing enhanced optical isolation for the lens array.

Another purpose is to enhance the optical isolation by providing a metal coating on selected portions of the glass element surface to function as an aperture mask.

A further purpose is to provide an aperture mask on the lens surface of the glass which is self-aligned with respect to a lens array on the surface.

A still further purpose is to utilize conventional photoresist techniques in providing the metal aperture mask.

Another purpose is to produce components on the plano side of a plano-convex lens array, or on the rear lens side of a convex-convex lens array.

A further purpose is to provide optical elements for assembly in a liquid crystal display (LCD) device.

PRIOR LITERATURE

The literature abounds with descriptions of photoresist materials and their use in such operations as metal etching and semiconductor production. The Kirk-Othmer Encyclopedia of Chemical Technology, Third Edition, Vol. 17, pp. 680–708 (1982) provides an extensive review of photoreactive polymers, their chemistry, and the manner in which they may be used. The details there disclosed are incorporated herein by reference.

U.S. Pat. No. 2,628,160 (Stookey) reviews several prior patents disclosing photosensitively opacifiable glasses in the course of describing a phenomenon of differential etching rates in certain partially opacified materials.

SUMMARY OF THE INVENTION

Our article is an improved version of the integral optical element described in the Bellman et al. patent with particular reference to FIG. 1 of that patent. The element comprises a glass body having opposed surfaces. At least one of the surfaces, and optionally both, has a pattern of raised, light-focusing, transparent optical lenses integral therewith. The body of the device has transparent channels that extend between the raised lenses and the opposed surface, and that are individually surrounded by a photonucleated, opacified glass matrix. In one alternative form, each transparent channel extends between a pair of lens elements, each on an opposed surface. The lens elements may be spherical microlenses in a uniform and closely spaced array on the device surface.

The improvement comprises a metal aperture mask on a surface of the device. The metal mask selectively extends over the surface of the photonucleated, opacified portion of the body, but not the raised optical elements, and forms a precisely self-aligned boundary between the raised elements and the mask, thereby optically isolating each optical element and adapting it to selectively transmit light.

In an alternative form, the optical element may further have a plano second surface also having a self-aligned metal mask over the matrix portion of that surface, an insulating film, which may be silica, over the metal mask and clear portions of the surface, and electrically conductive, light transmitting pads covering the insulating film over the surfaces of the clear channels.

One aspect of the inventive method produces an optical element having opposed surfaces, an array of raised, transparent optical lenses integral with a first opposed surface, transparent channels extending between the raised optical lenses and a second opposed surface, an opaque matrix surrounding the transparent channels, and a self-aligned metal mask covering the matrix, but not the lenses, to optically isolate each lens and adapt it to selectively transmit light.

The method comprises the steps of separately applying both a metal film and a photoresist coating over the entire first surface, selectively exposing the photoresist covering the transparent optical lenses on the glass surface and selectively removing a portion of the photoresist, removing that portion of the metal film covering the lenses, and removing the remainder of the photoresist to leave a metal mask covering only the matrix portion of the surface.

In one embodiment, a metal film is applied first, a positive resist coating is applied over the metal film, the photoresist is selectively exposed through the raised lens portions, the exposed resist and underlying metal are removed, and then the unexposed resist is removed to uncover the metal mask surrounding the lenses.

In another form, a negative resist is applied over the entire surface and exposed through the lenses. The unexposed resist is now removed leaving the lenses covered with exposed resist. Thereupon, a metal film is deposited, as by vacuum deposition. In that case, the metal covers the entire surface, and the lenses are then uncovered by removing the exposed resist, as by ultrasonic treatment. Alternatively, the metal may be applied by electroless metallization.

In another embodiment, the method comprises the further steps of separately applying a metal film and a photoresist film over the opposed second surface of the optical element, selectively exposing the photoresist through the unmasked lenses on the first surface, removing a portion of the photoresist, removing the metal from the clear portions of the second surface and removing the remainder of the photoresist to provide a metal mask covering only the matrix portion of the second surface, and self-aligned with the mask on the first surface. Lens effect, whereby light converges during exposure through the lenses, can be avoided wholly or partially by employing an appropriate index oil with the lenses.

The optical element, with both surfaces bearing aligned masks, may then have an insulating film applied over the entire second surface and a layer of electrically conductive, light transmitting material applied over the insulating film. A layer of photoresist may then be applied, exposed through the lens array on the first surface, the unexposed resist removed and the exposed conductive material removed. This produces an optical element that may be assembled in a liquid crystal display device.

DESCRIPTION OF THE INVENTION

Figure 1:
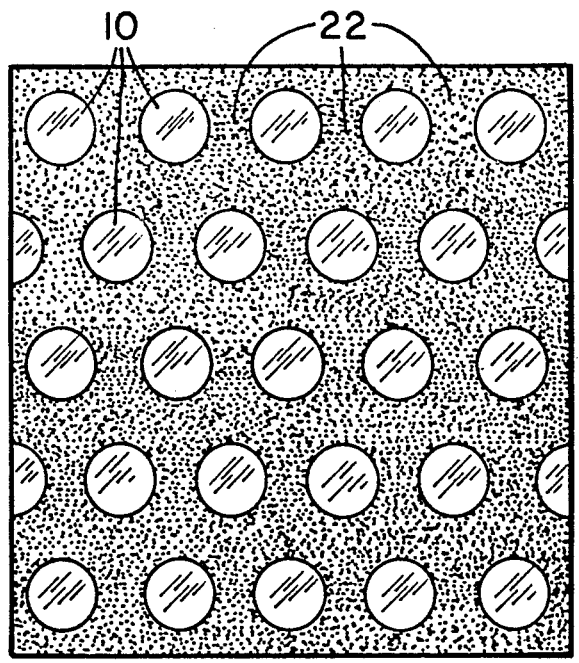
FIG. 1 is a top plan view of an optical element as disclosed in the Bellman et al. patent.

As noted, the present invention is an improvement modification, of an optical element disclosed in Bellman et al. U.S. Pat. No. 4,572,611. That element is characterized by one or more optical microlenses integral with, and raised above, a glass surface. The element usually involves a plurality of lens systems 10 in a pattern or array, as illustrated in FIG. 1. However, for better illustration, a single lens system is shown in FIGS. 2 and 4.

FIG. 1 is a top plan view of an array of lens systems 10 surrounded and optically isolated by a continuous matrix of photonucleated, opacified glass 22. Lens systems 10 may be in any desired pattern, a common one being one or more arrays of uniformly separated systems.

Figures 2, 4:
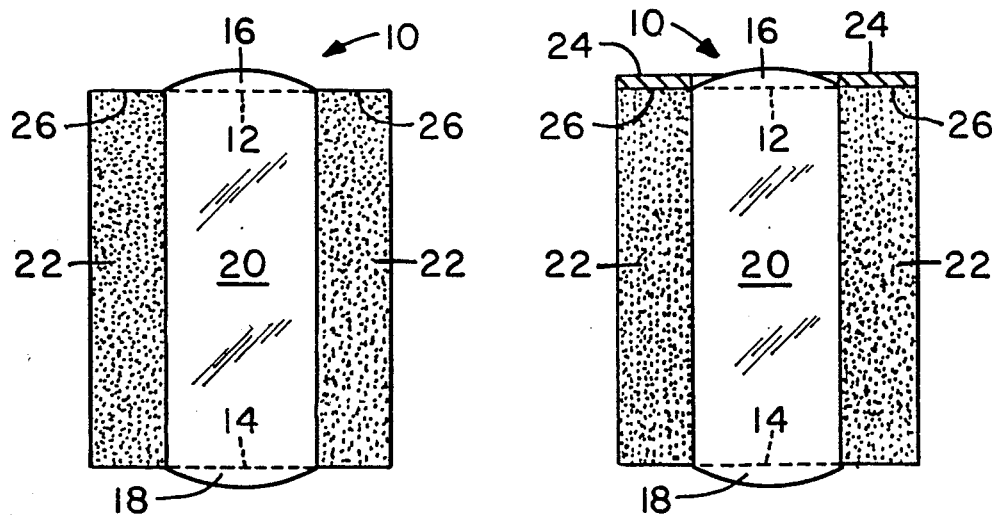
FIG. 2 is a cross-sectional view of a single convex-convex lens system as disclosed in the Bellman et al. patent.
FIG. 4 is a cross-sectional view of the single lens system of FIG. 2 as modified in accordance with the invention.

A single lens system 10 of FIG. 1 is shown in cross-section in FIG. 2. Lens system 10 is shown as a glass cylinder 20 having opposed bases 12 and 14 integrally surmounted by spherical microlenses 16 and 18, respectively. Connecting microlenses 16 and 18 is transparent, clear glass cylinder 20 corresponding in cross-section to the base of each micro-lens. Surrounding cylinder 20 is a matrix of photonucleated, opacified glass 22 which acts as a barrier to passage of light between cylinders 20.

The photonucleated, opacified glass 22 surrounding clear glass cylinders 20 has light transmission characteristics that vary with wave length. This is illustrated in FIG. 3, a graphical representation in which light transmission is plotted against light wavelengths.

Figure 3:
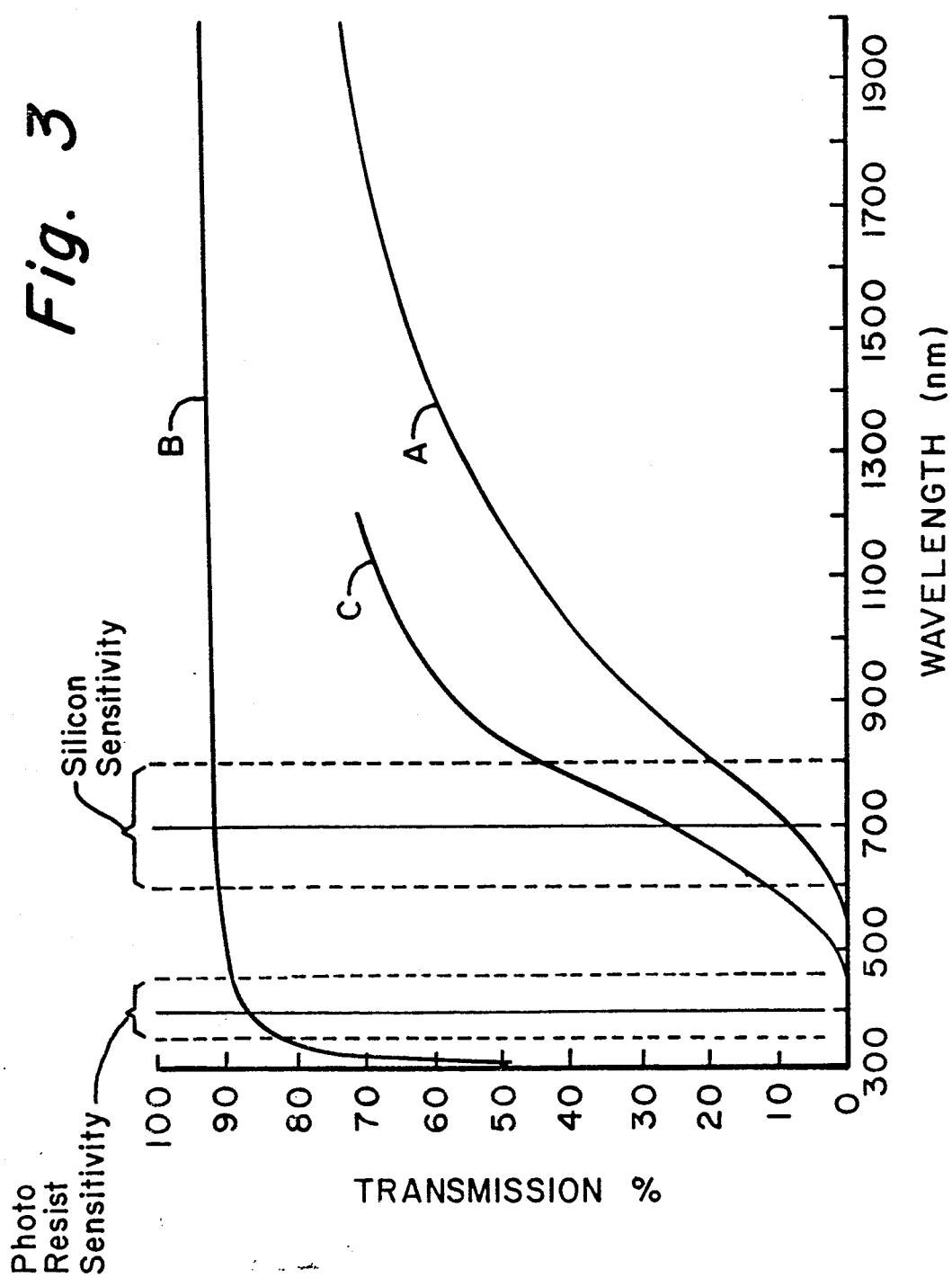
FIG. 3 is a graphical representation in which light transmission is plotted against light wavelengths.

In FIG. 3, transmission values in percent (%) are plotted along the vertical axis, while wavelengths are plotted along the horizontal axis in nanometers (nm.). Curve A represents transmission through a one mm. thick sample of opal glass 22. Curve B represents transmission through clear glass such as clear glass cylinder 20. Curve C represents transmission through a 0.5 mm thick sample of opal glass 22.

. It will be observed that transmission through the one mm. sample of opacified glass 22 rises significantly so that the value at 600 nm. is 2%; the value at 700 nm. is 7%; and the value at 800 nm. is 20%. In a 0.5 mm. sample, such as contemplated for a commercial application, these values are equivalent to 14% transmission at 600 nm.; 26% at 700nm; and 45% at 800 nm.

FIG. 3 also shows, by vertical dashed lines, (a) the zone of maximum sensitivity of photoresist materials, the use of which is described subsequently, and (b) the zone of maximum sensitivity of silicon, a material used for detection of light passing through cylinders 20 in an operating imaging device. It is readily apparent that opacified glass 22 requires further masking in order to be used with a silicon photoreceptor. It is also apparent that opal glass 22 is quite opaque (about 2% transmission in a 0.5 mm. thick sample) in the sensitivity zone of the photoresist materials.

Therein lies the key to the present invention. We have found that, if a photoresist material on an element surface is exposed through an array of lens systems 10, the opacified glass 22 functions as an aperture mask for resist exposure. The opacified glass essentially prevents light passage in the zone around 400 nm. wavelength, while clear glass 20 transmits almost at maximum at that wavelength. Thus, the opacified glass acts as a self-aligning exposure mask for the photoresist. Removal of the selectively exposed resist enables establishing a metal aperture mask about the microlenses with micron tolerances. In contrast, the best tolerances on wafer form systems by other masking means is on the order of ±0.1 mm.

FIG. 4 shows the lens system of FIG. 2 with the several features having corresponding numerals. In accordance with the present invention, the primary light receiving surface of the element is selectively coated with a layer of light absorbing metal 24 that completely covers only the surface 26 of opacified glass matrix 22. This leaves microlens 16 uncoated.

It will be appreciated that, in an array of lens systems as shown in FIG. 1, metal coating 24 becomes an effective aperture mask for the device. Thus, the coating intercepts light from reaching the surface of opacified portion 22, while not interfering with light directed to microlenses 10. In accordance with the inventive methods hereafter described for selectively applying a metal coating, the aperture mask is self-aligned by techniques embodying exposing a photoresist material through the lens systems 10.

Figure 5A:
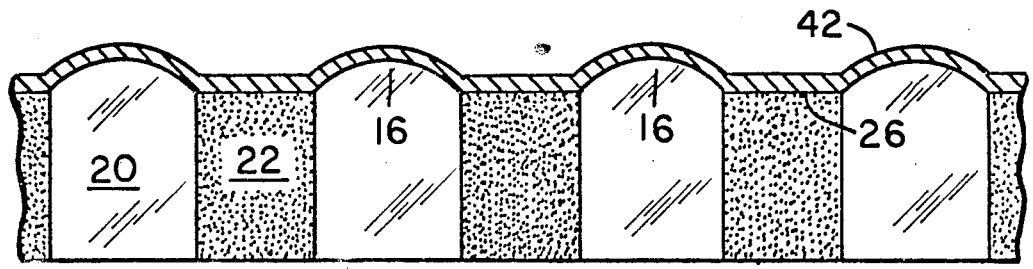
FIGS. 5A, 5B, 5C and 5D are a sequential, schematic illustration of a method of producing the inventive modification of FIG. 4, FIGS. 6A, 6B, 6C and 6D are a sequential, schematic illustration of another method of producing the inventive modification of FIG. 4, FIGS. 7A, 7B, 7C and 7D are a sequential, schematic illustration of a method of producing a further modification of the optical element product of FIGS. 5D or 6D, FIGS. 8A, 8B, 8C and 8D are a sequential, schematic illustration of a method of further modifying the product of FIG. 7D.

FIGS. 5A, 5B, 5C and 5D are a progressive depiction of one process for selectively applying metal coating 24 over surface 26 of matrix glass 22. In this four-step process, a thin layer of metal 42, e.g. chromium, is sputtered over the entire surface of a device, that is surface 26 plus microlenses 16, as shown in FIG. 5A. This film should provide a transmission of from 1 to 10% to permit sufficient light passage to activate a photoresist. In the case of chromium, metal film 42 may have a thickness of 40 to 70 nanometers.

Figure 5B:
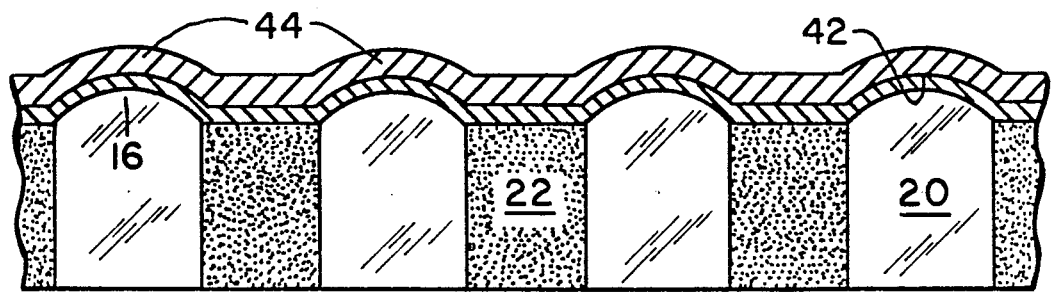

In the step of FIG. 5B, a layer of a positive photoresist 44 is applied over metal layer 42. Photoresist layer 44 may be applied by spinning to obtain a layer of uniform thickness.

Figure 5C:
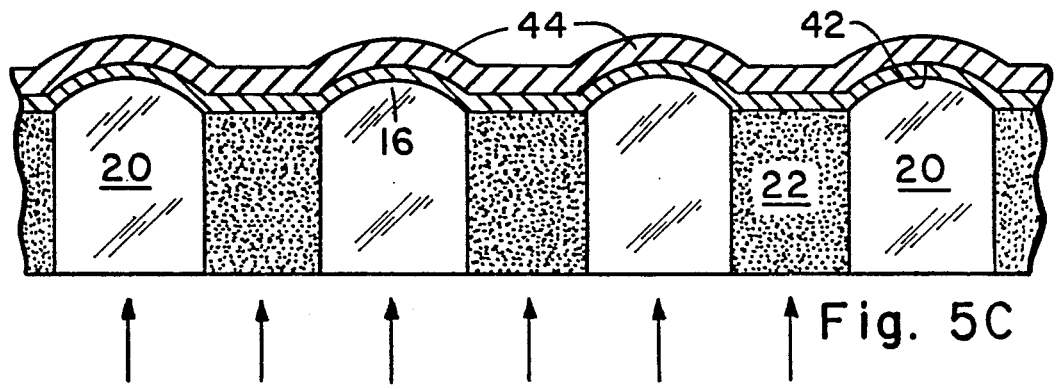

The step of FIG. 5C requires exposing the photoresist through the back, or plano, side of microlens 16. Thus, activating light passes through channel 20, into microlens 16, and through metal film 42, as shown bY arrows.

Figure 5D:
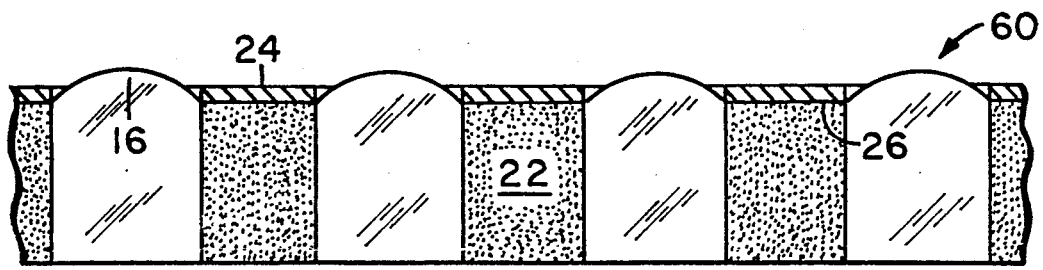

The exposed photoresist is then dissolved. This uncovers the chromium over the microlenses 16. The exposed metal may then be dissolved to fully expose the microlenses. Finally, the unexposed photoresist may be removed by stripping. This exposes the desired metal film network, or mask, self-aligned with underlying, opacified glass matrix 22 as shown in FIG. 5D.

Figure 6A:
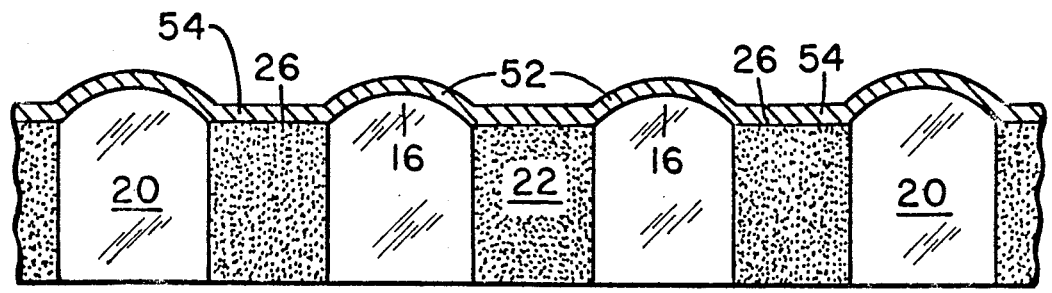

FIGS. 6A, 6B, 6C and 6D illustrate, also in progressive views corresponding to the process steps, another method of selectively applying a metal film network, or mask 24, over the surface of opacified glass portion 22 of an imaging device. In the step of FIG. 6A a negative resist layer 52 is applied over the entire surface of the device. This layer may be applied by dry film lamination or spinning as described above with respect to FIG. 5B.

Figure 6B:
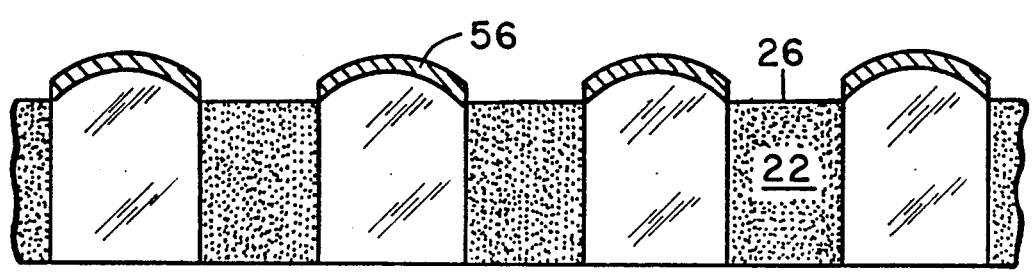

The negative resist layer 52 is then exposed from the rear, that is by light transmitted up channels 20 and through microlenses 16, as shown by arrows. The unexposed resist 54 covering the surface of glass 22 is now removed by stripping. This leaves exposed resist 56 covering microlenses 16 as shown in FIG. 6B.

Figure 6C:
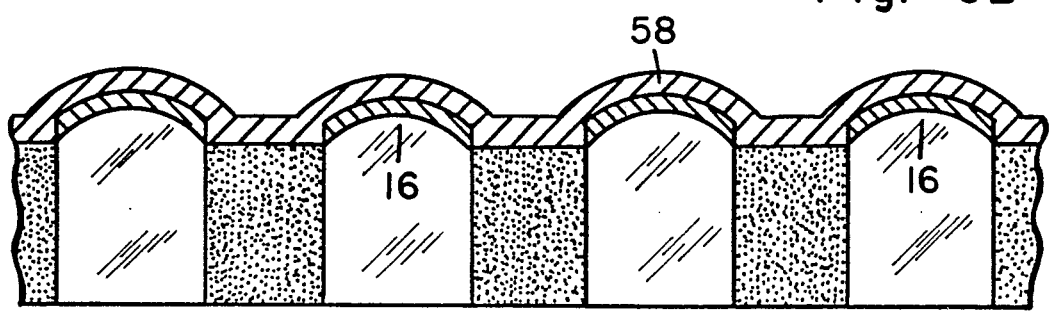
Figure 6D:
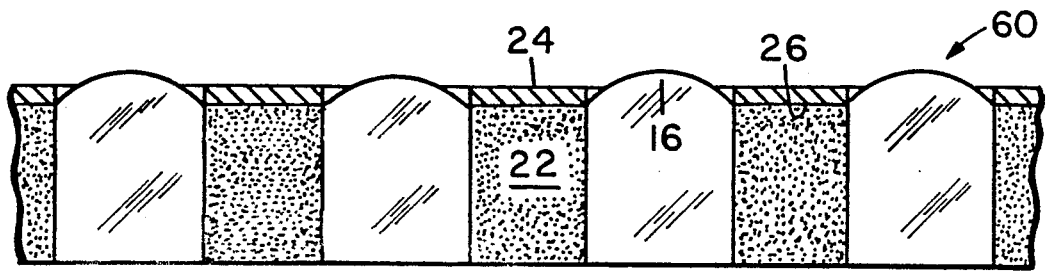

With the surface 26 of glass 22 thus exposed, a film of metal 58 is sputtered over the entire surface, as shown in FIG. 6C. The metal coated surface is now subjected to a resist solvent or ultrasonic vibration to remove exposed resist 56, and consequently the overlying metal, from microlenses 16. This leaves a metal network 24 covering the matrix surface 26 of glass 22 as shown in FIG. 6D.

The method illustrated in FIGS. 6A, 6B, 6C and 6D and just described, may be varied by applying metal film 58 by electroless metallization. Thereafter, the resist and metal covering microlenses 16 may be removed by a resist solvent or by ultrasonic vibration. Care must be taken not to apply too heavy a metal film. Otherwise, it may be difficult to obtain clean removal of the metal.

The optical element, as described thus far and designated by the numeral 60 in FIGS. 5D and 6 D, finds principal utility in light-focusing, imaging apparatus such as reproduction machines and cameras. FIG. 7A–11 illustrate production of a further modified element that may be used, for example in a liquid crystal display apparatus.

Figure 7A:
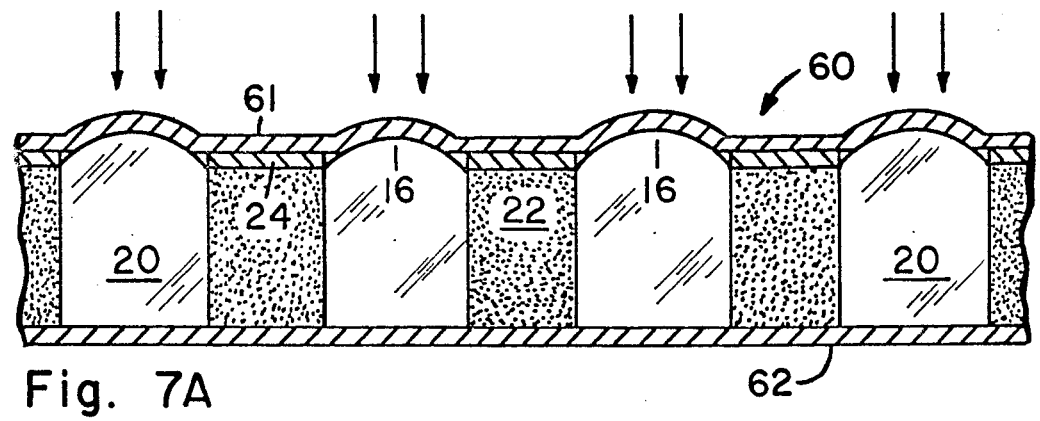

FIGS. 7A, 7B, 7C and 7D depict a process for further modifying the optical element 60 to provide a self-aligned metal mask on the opposed, plano surface of the element. In the step of FIG. 7A, an anti-reflecting coating may be applied to the first surface of element 60, that is at least over the lens surfaces and preferably over the metal mask as well. This may, for example, be a quarter wavelength layer of a known anti-reflecting coating such as chromium oxide 61. Layer 61 may be applied by any known application method, such as sputtering, evaporation, or vacuum deposition. As a further precaution, an anti-reflecting film may be applied both before and after forming metal mask 24.

Next, a layer of negative photoresist 62 is applied over the plano surface of element 60. Collimated light is then passed through microlenses 16 and down transparent cylinders 20 to expose only the resist covering the surface of cylinders 20.

It will be appreciated that microlenses 16 tend to focus light as subsequently illustrated in FIG. 9. To avoid this, and to utilize the full area under cylinders 20, a matching index oil may be provided to cover lenses 16.

Figure 7B:
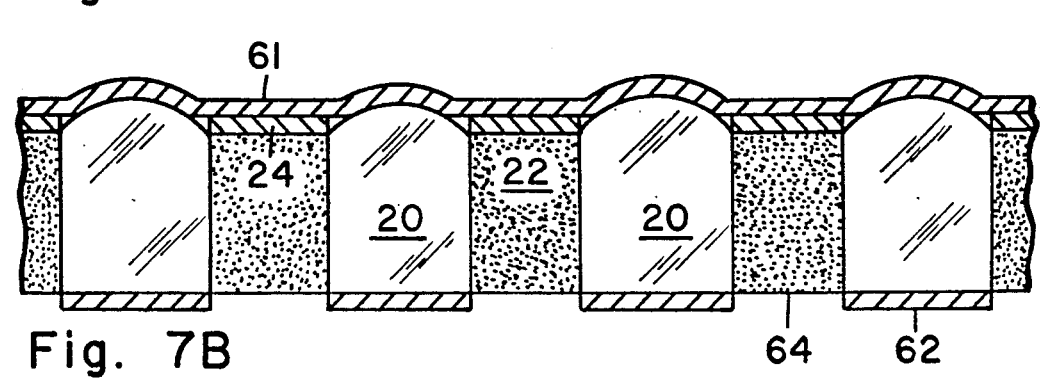
Figure 7C:
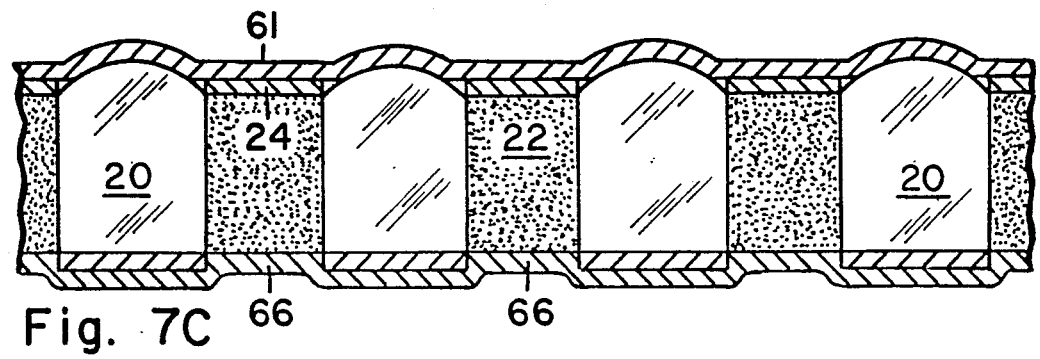

In step of FIG. 7B the unexposed photoresist is removed from matrix surface 64. As shown in the step of FIG. 7C, a layer of metal 66, for example, chrome, may then be applied over the entire second surface by either evaporation or sputtering. The exposed resist under channels 20, and the metal overlying such resist are then stripped. This leaves the surfaces of the channels clear with a metal mask 68 covering the surface of matrix 22 as illustrated FIG. 7D. The mask will be self-aligned both with the channels and with mask 24 on the first surface of the element.

Figure 7D:
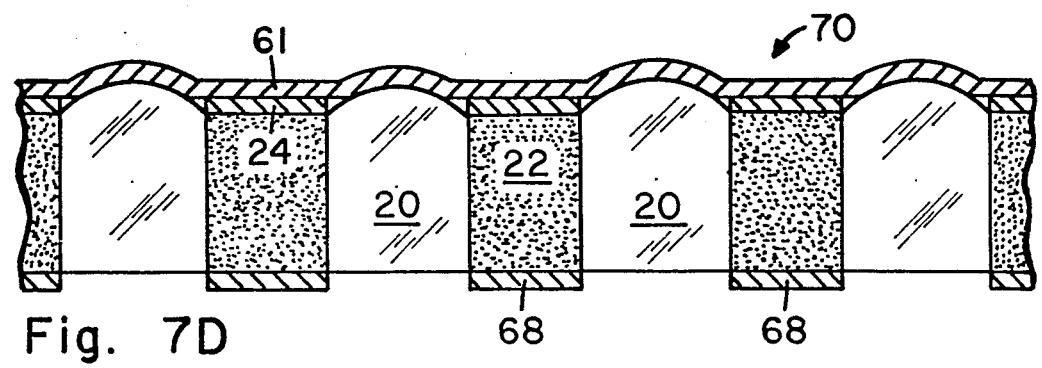

FIGS. 8A, 8B, 8C and 8D illustrate a further modification of the doubly masked element 70 of FIG. 7D.

Figure 8A:
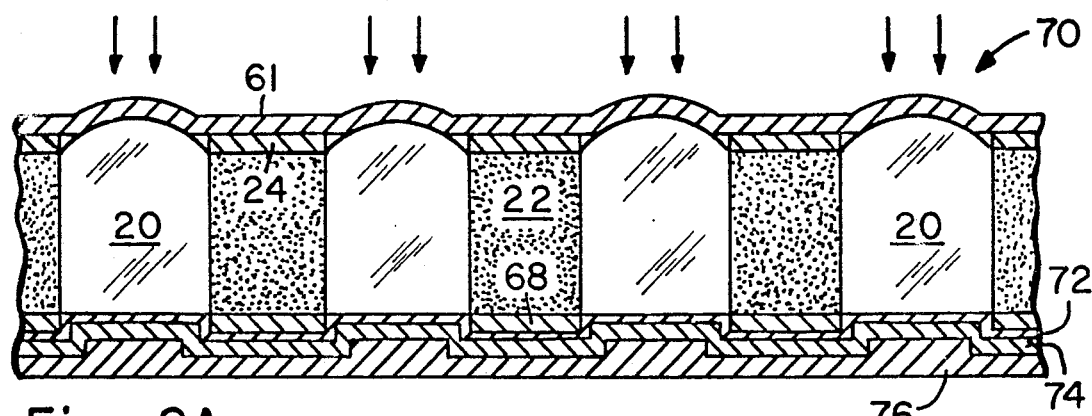

In the step of FIG. 8A a thin, electrically insulating, optically conducting layer 72 is applied over the entire second surface. This may, for example, be a thin silica film that may be applied by sputtering or by evaporation. This insulates the mask from further materials to be applied. In particular, a film of electrically conductive material 74 may be applied over insulating film 72. This may for example be an indium oxide film doped with tin oxide (known as ITO) as disclosed in U.S. Pat. No. 2,564,709 (Mochel).

A layer of negative resist 76 is then applied over the ITO film and exposed through lenses 16 and cylinders 20. If full coverage of the cylinder surface is desired, a matching index fluid will be used with lenses 16.

Figure 8B:
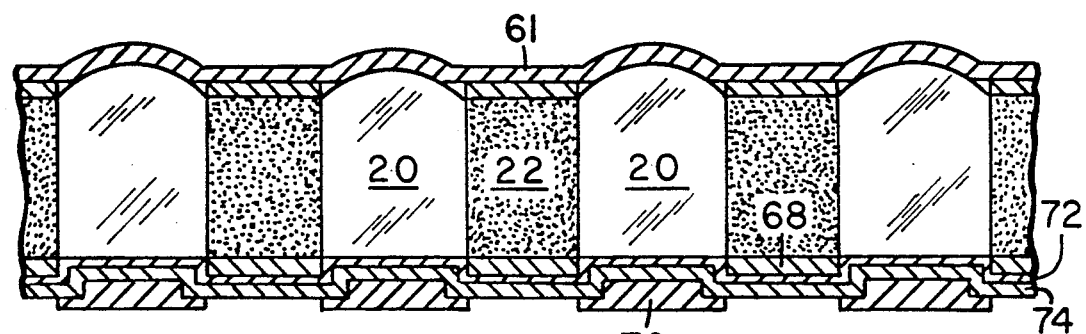
Figure 8C:
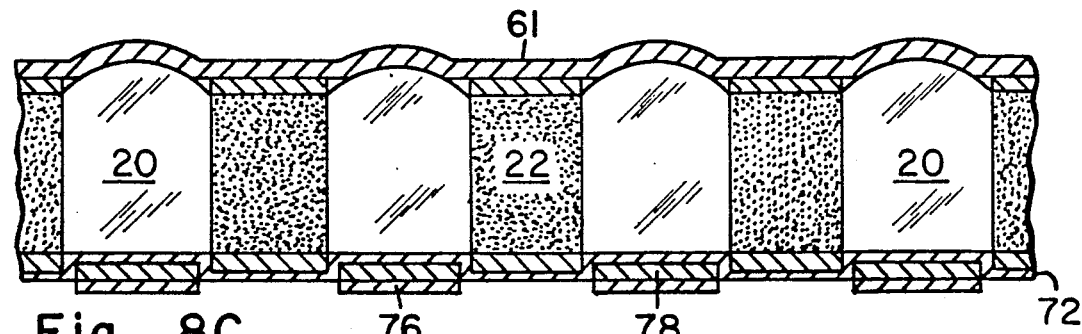
Figure 8D:
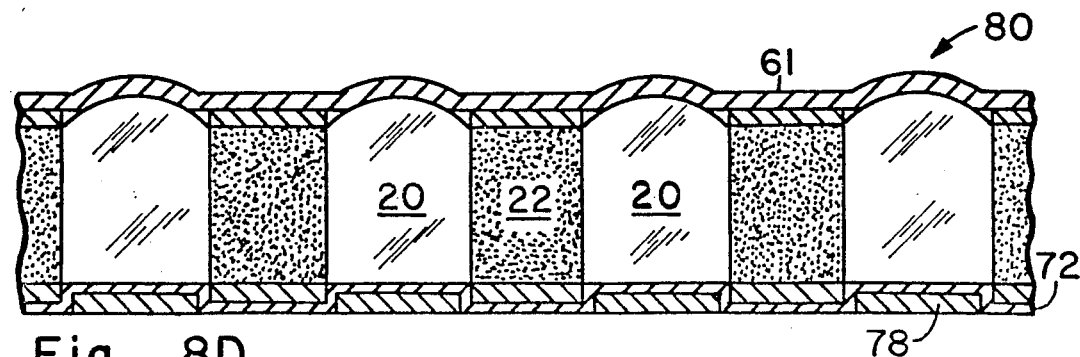

The unexposed resist, that is the portions underlying matrix 22, is then removed to uncover corresponding portions of electrically conductive film 74, as shown in FIG. 8B. The portions of ITO film thus uncovered be removed for example, by chemical etching, in the step of FIG. 8C. This provides circular pads 78 of ITO film which may function as electrodes when the exposed resist is removed from their surface, as shown in FIG. 8D. The element thus produced is designated, in FIG. 8D, as 80.

Figure 9:
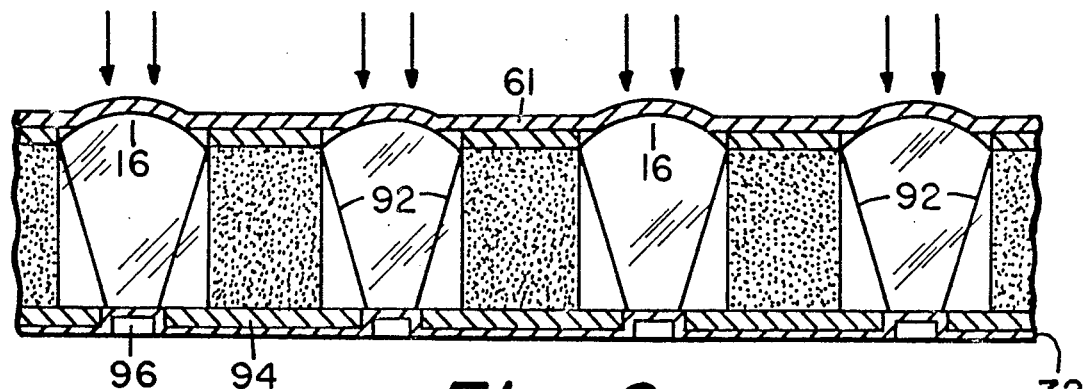
FIG. 9 is a schematic illustration of an optical element produced by varying the method of FIGS. 8A, 8B, 8C and 8D.

FIG. 9 depicts the situation that prevails when light is passed through lenses 16 without employing a matching index liquid. Thus, light entering lenses 16 is focused as indicated by converging 92. As a result, when the procedures of FIGS. 7A through 8D are carried out in this manner, an enlarged metal mask 94 is produced, and conductive pads 96 are of smaller size. It will be appreciated that proper selection of index fluids will permit control of light convergence, and, consequently, control of conductive pad size.

Figure 10:
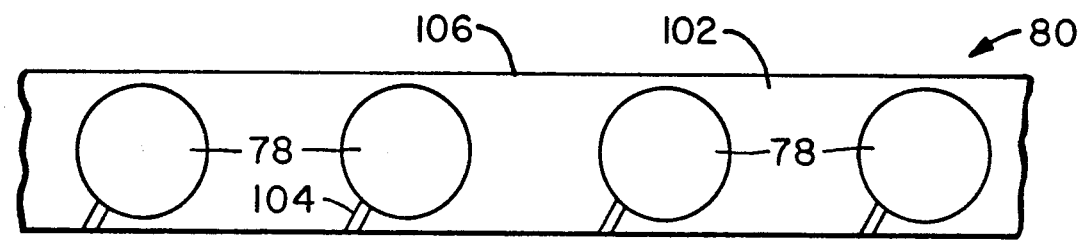
FIG. 10 is a schematic illustration of the element of FIG. 8D with electrical leads added.

Electro-optic element 80 may be further processed for use in display apparatus and like applications. FIG. 10 is a plan view of the underside 102 of element 80. As shown, electrical leads 104 may be provided between each conductive pad 78 and an edge 106 of element 80.

Leads 104 may conveniently be provided by exposing the photoresist layer 76 through a separate mask before removal of the unexposed resist. This mask will have openings corresponding only to the pattern for leads 104. It may be noted that the function of leads 104 is to provide electrical paths from pads 78 to an edge 106 where electrical contact may be made by soldering or other conventional technique. Hence, the precise location of leads 104 is not critical as long as electrical connection to pads 78 is achieved.

Figure 11:
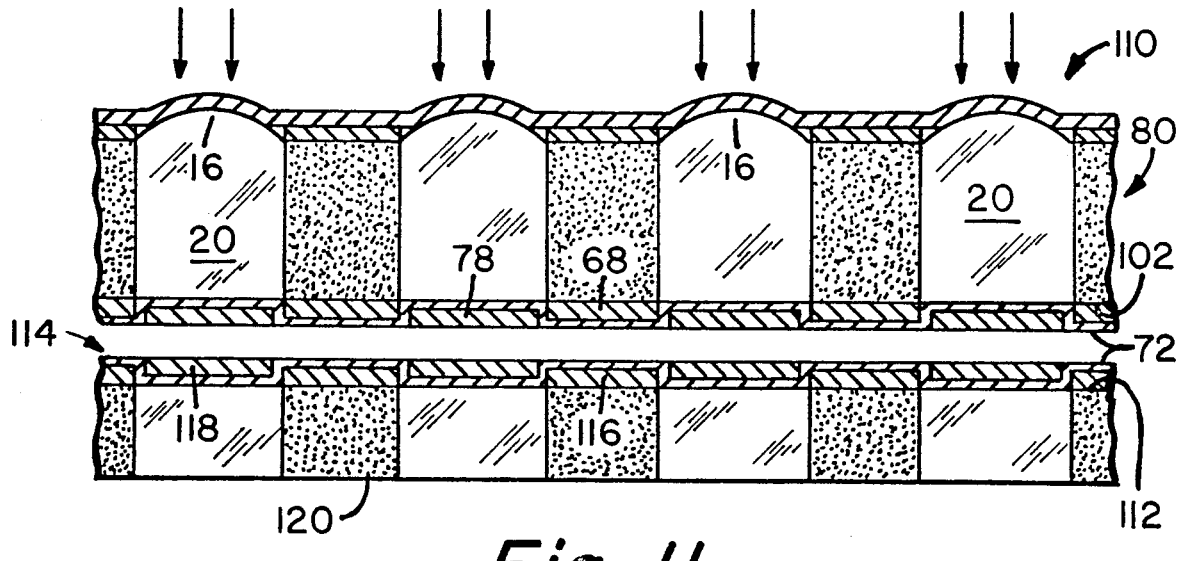
FIG. 11 is a schematic illustration of a liquid crystal display device embodying the optical element product of FIG. 10.

FIG. 11 schematically illustrates an application of electro-optic element 80 of FIG. 10, namely a liquid crystal display device 110. As shown in side view, element 80 is assembled with its under surface 102, bearing electrode pads 78, in facing relationship to an electrode bearing surface 112 of a second electro-optic element 114.

Element 114 may correspond in structure and production to element 80. However, FIG. 11 shows a simplified version that has a plano outer surface 120 and no metal mask on that surface.

The version shown in FIG. 11 may be produced concurrently with element 80. Thus, metal mask 116 and electroconductive pads 118 may be produced on inner surface 112 of element 114 by employing the same sequence of coating and processing steps as described for element 80. Further, the two elements may be processed in a stacked arrangement. Thus, light passing through lenses 16 and cylinders 20 may expose photoresist coatings on the two elements simultaneously. This has the significant further advantage that the electrodes on each element may be in precise alignment with each other.

While the invention has been described with respect to specific light-focusing and electro-optic applications, it will be appreciated that other applications are contemplated, and that the precise manner of processing and nature of the element produced may vary to fit specific details of such applications. In particular, while use of a negative photoresist was described with respect to FIGS. 7A through 9, the positive resist procedure described with reference to FIGS. 6A, 6B, 6C and 6D could equally well be employed to achieve the desired electro-optic elements.

We claim:

1. In an optical element having opposed surfaces, an array of raised, transparent, optical lenses integral with a first surface, transparent channels extending between the raised optical lenses and the opposed second surface, and an opaque matrix surrounding the transparent channels, the improvement comprising a self-aligned metal mask extending over the matrix portion of the first surface, but not over the raised optical lenses, to form a precisely self-aligned boundary between the raised lenses and the mask, thereby optically isolating each lens and adapting it to selectively transmit light.

2. An optical element in accordance with claim 1 wherein the element comprises a photosensitive glass body and the matrix portion has a photonucleated opacity.

3. An optical element in accordance with claim 1 wherein both opposed surfaces have a pattern of raised, light-focusing, transparent, optical lenses integral therewith and each transparent channel extends between an opposed pair of said optical lenses.

4. An optical element in accordance with claim 1 wherein the raised optical lenses are spherical microlenses.

5. An optical element in accordance with claim 1 wherein the thickness of the metal mask is such that the mask is adapted to transmit in the range of 1-10% of visible light impinging thereon.

6. An optical element in accordance with claim 1 wherein the mask metal is chromium.

7. An optical element in accordance with claim 6 wherein the mask metal thickness is in the range of 40 to 70 nanometers.

8. An optical element in accordance with claim 1 wherein an anti-reflecting coating is applied over at least the lenses on the first surface.

9. An optical element in accordance with claim 8 wherein the anti-reflecting coating is a quarter wavelength layer of chromium oxide.

10. An optical element in accordance with claim 1 wherein the opposed second surface is a plano surface having a self-aligned metal mask covering the matrix portion of that surface, an insulating film covering the metal mask and the clear portions of the surface, and electrically conductive, light transmitting pads covering the insulating film over the surfaces of the clear channels.

11. An optical element in accordance with claim 10 wherein the insulating film is silica.

12. An optical element in accordance with claim 10 wherein the electrically conductive pads are composed of indium oxide doped with tin oxide.

13. An optical element in accordance with claim 10 wherein an electrically conductive lead extends from each conductive pad to an edge of the element.

14. An optical element in accordance with claim 13 wherein a second insulating film covers the electrically conductive pads and leads.

15. An optical element in accordance with claim 10 assembled in spaced relation with a second optical element having electrically conductive pads, the pads on the two elements facing each other in an aligned pattern and being separated by a liquid crystal medium.

16. A method of producing an optical element having opposed surfaces, an array of raised, transparent optical lenses integral with a first opposed surface, transparent channels extending between the raised optical lenses and a second opposed surface, an opaque matrix surrounding the transparent channels, and a self-aligned metal mask covering the matrix, but not the lenses, to optically isolate each lens and adapt it to selectively transmit light, the method comprising
a. separately applying a metal film and a photoresist film over the entire first surface,
b. selectively exposing the photoresist covering the lenses,
c. removing a portion of the photoresist,
d. removing that portion of the metal film covering the lenses, and e. removing the remainder of the photoresist, to leave a metal mask covering only the matrix portion of the first surface 17. A method in accordance with claim 16 wherein the metal applied is chromium.

18. A method in accordance with claim 17 wherein the thickness of the chromium film is in the range of 40 to 70 nanometers.

19. A method in accordance with claim 16 wherein the thickness of the metal film is such as to provide in the range of 1 to 10% light transmission.

20. A method in accordance with claim 6 wherein a metal film is applied over the said entire first surface initially, a positive photoresist film is applied over the metal film, the positive photoresist is selectively exposed through the second surface of the optical element, the exposed portion of the resist is removed to expose the underlying metal, the said exposed metal is removed and the unexposed photoresist is then removed to uncover the metal mask formed about the optical lenses.

21. A method in accordance with claim 20 wherein the thickness of the metal film is such as to provide in the range of 1 to 10% transmission of the activating light for the photoresist.

22. A method in accordance with claim 16 wherein a negative photoresist is applied over the said entire first surface initially, the negative photoresist is selectively exposed through the second surface of the optical element, the unexposed resist is removed leaving the optical lenses covered with exposed photoresist, a metal film is then deposited over the entire surface and the exposed resist and metal overlying said exposed resist are simultaneously removed to bare the optical lenses and leave a metal mask formed about the lenses.

23. A method in accordance with claim 22 wherein the metal film is applied by vacuum deposition.

24. A method in accordance with claim 22 wherein the exposed resist and overlying metal are removed by ultrasonic treatment.

25. A method in accordance with claim 22 wherein the exposed resist and overlying metal are removed with a solvent for the resist.

26. A method in accordance with claim 22 wherein the metal film is applied by electroless metallization.

27. A method in accordance with claim 16 comprising the further step of applying an anti-reflecting coating over at least the lenses on the first surface.

28. A method in accordance with claim 27 wherein the anti-reflecting coating is a quarter wavelength layer of chromium oxide.

29. A method in accordance with claim 16 comprising the further steps of
a. separately applying a metal film and a photoresist film over the opposed second surface of the optical device,
b. selectively exposing the photoresist through the unmasked lenses on the first surface,
c. removing a portion of the photoresist,
d. removing the metal from the clear portions of the second surface, and
e. removing the remainder of the photoresist to provide a metal mask covering only the matrix portion of the second surface and self aligned with the mask on the first surface.

30. A method in accordance with claim 29 wherein a metal film is initially applied over the opposed second surface, a positive photoresist film is applied over the metal film, the positive photoresist is selectively exposed through the unmasked lenses of the first surface, the exposed portion of the resist is removed to expose the underlying metal, the exposed metal is removed and the unexposed resist is then removed to provide a metal mask covering only the matrix portion of the surface.

31. A method in accordance with claim 30 wherein the underlying metal is removed by chemical etching.

32. A method in accordance with claim 29 wherein a negative photoresist is initially applied over the opposed second surface, the negative photoresist is selectively exposed through the unmasked lenses of the first surface, the unexposed resist is removed, a metal film is deposited over the entire second surface and the exposed resist and overlying metal are simultaneously removed to provide a metal mask covering only the matrix portion of the second surface.

33. A method in accordance with claim 32 wherein the exposed resist and overlying metal are removed by ultrasonic treatment.

34. A method in accordance with claim 29 wherein an electrically insulating, light transmitting layer is applied over the metal mask and exposed surface of the second surface.

35. A method in accordance with claim 34 wherein the insulating layer is a silica film.

36. A method in accordance with claim 34 wherein a layer of electrically conductive, light transmitting material is applied over the insulating film, a layer of photoresist is applied over the conductive film, the photoresist is exposed through the lenses on the first surface, the unexposed resist is removed, and the conductive material thus exposed is removed to form electrically conductive pads.

37. A method in accordance with claim 36 wherein the electrically conductive material is indium oxide doped with tin oxide.

38. A method in accordance with claim 36 wherein, before the unexposed photoresist is removed, it is exposed through a further mask to produce exposed channels between the first exposed areas and the edge of the surface, thereby providing conductive paths to the surface.

39. A method in accordance with claim 38 wherein an insulating film is applied over the electrically conductive material and the exposed portions of the first insulating film.

40. A method in accordance with claim 36 wherein a second optical device is prepared in the same manner and assembled with the conductive pads in spaced facing relationship with a liquid crystal layer therebetween.

* * * * *